United States Patent [19]

Bacher

[11] 4,071,881
[45] Jan. 31, 1978

[54] DIELECTRIC COMPOSITIONS OF MAGNESIUM TITANATE AND DEVICES THEREOF

[75] Inventor: Rudolph John Bacher, New Castle, Del.

[73] Assignee: E. I. Du Pont de Nemours and Company, Wilmington, Del.

[21] Appl. No.: 672,031

[22] Filed: Mar. 30, 1976

[51] Int. Cl.$^2$ .................. C04B 35/00; H01G 4/20
[52] U.S. Cl. ................... 361/320; 106/39.6; 106/53; 106/73.3; 106/73.33
[58] Field of Search ......... 106/73.3, 53, 39.8; 317/258; 361/320, 321

[56] References Cited

U.S. PATENT DOCUMENTS

| | | | |
|---|---|---|---|
| 2,691,088 | 10/1954 | Ungewiss | 106/73.3 |
| 3,267,342 | 8/1966 | Pratt et al. | 317/258 |
| 3,470,002 | 9/1969 | Dimarcello et al. | 106/53 X |
| 3,787,219 | 1/1974 | Amin | 106/39.8 |
| 3,819,990 | 6/1974 | Hayashi | 317/258 |
| 3,940,255 | 2/1976 | Harrington et al. | 106/39.8 |
| 3,950,174 | 4/1976 | Suzuki et al. | 106/53 |
| 3,996,502 | 12/1976 | Bratschun | 361/321 |

OTHER PUBLICATIONS

Bacher, R. J. et al. "Thick Film Temperature-Compensating Capacitor Dielectrics"Pub. by I.E.E.E., 24th Electronic Components Conf., Washington, pp. 87–93, May 1974.
Electronic and Newer Ceramics-pub. by Ind. Pub. Co. Chicago (1959) "Magnesium Titanate", p. 184.

*Primary Examiner*—Helen M. McCarthy

[57] ABSTRACT

Dielectricpowder compositions of magnesium titanate plus a glass, useful for forming dielectric layers in multilayer electrode/dielectric structures on an alumina substrate. Also, dispersions of such compositions in a vehicle and the resultant multilayer structures.

23 Claims, No Drawings

DIELECTRIC COMPOSITIONS OF MAGNESIUM TITANATE AND DEVICES THEREOF

BACKGROUND OF THE INVENTION

This invention relates to printed circuits, and more particularly to compositions for producing dielectric layers for use in such circuits.

It is useful in fabricating printed circuits to be able to conserve space by disposing a metallization directly above other metallizations. To prevent shorting and reduce capacitance coupling, such metallizations are separated by dielectric material.

There are two ways to produce such multilayer structures. The first consists of printing and firing "crossover" layers between printed conductor layers on a single substrate, to form what is sometimes called a "multilevel" printed wiring board. The second method involves printing conductor patterns on organic-bonded thin "tapes" of particulate alumina, then laminating such printed tapes and firing the resultant laminated structure at high temperature to make a discrete monolithic multilayer structure which serves as its own substrate. The present invention describes the role of certain compositions in forming, *inter alia,* crossover dielectric layers in the "multilevel" type of process, wherein the substrate is a prefired alumina ceramic.

A crossover dielectric composition is essentially a low dielectric constant insulator capable of separating two conductor patterns through several firing steps. High melting, viscous glasses have been used as the dielectric so that the firing of the top conductor line can be carried out at a temperature below that at which softening of the dielectric occurs. Melting or softening of the crossover dielectric is accompanied by shorting of the two conductor patterns against each other with subsequent failure of the electrical circuit. The major requirement for a crossover dielectric is control of resoftening or thermoplasticity in the top conductor firing step. Other property requirements are: (a) low dielectric constant to produce low A.C. capacitance coupling between the circuits insulated by the crossover dielectric, (b) low electric loss (high Q) to avoid dielectric heating, (c) low "pinholing" tendency and a low tendency to evolve gasses in firing, (d) proper glass softening temperature so that the initial firing is adaptable to the screen printing process, (e) a high resistance to thermal shock crazing, and (f) low sensitivity to water vapor and subsequent spurious electrical losses.

Also required are compositions for producing dielectric layers in multilayer capacitors printed on an alumina substrate. Such capacitors include those of Bacher et al. U.S. Pat. No. 3,683,245 and Bergmann U.S. Pat. No. 3,679,943, each of which is incorporated by reference herein.

Among the numerous compositions known for producing dielectric layers in multilayer structures are compositions based upon glasses, such as the crystallizable glasses of Hoffman U.S. Pat. No. 3,586,522 or Amin U.S. Pat. No. 3,785,837; or upon mixtures of crystalline materials and glasses such as Amin U.S. Pat. No. 3,787,219 and Bacher et al. U.S. Pat. No. 3,837,869. Each of these four patents is incorporated by reference herein.

Often the alumina substrate on which multilayer structures are formed is distorted or bowed by forces exerted by the fired dielectric layer(s). There is a need for dielectric compositions which have thermal expansion characteristics such that bowing is reduced, since otherwise poor film adhesion can result.

Reduction in alumina substrate bowing caused by many commercially available dielectric compositions is important, since distorted (non-planar) substrates makes alignment difficult in printing subsequent layers on the substrate. Also, bowed substrates are more difficult to mount into connector assemblies. Furthermore, the compressive forces exerted by the dielectric layer can result in cracking of the alumina substrate when it undergoes thermal cycling, for example, in dip soldering of the electrodes. The fired dielectric layers must be nonporous, as defined herein, and fireable at temperatures compatible with the firing temperatures of typical electrode compositions (e.g., below 975° C.). Furthermore, when crystalline fillers are used, the fillers should have dielectric constants which are relatively low.

SUMMARY OF THE INVENTION

I have invented certain compositions useful for printing dielectric layers in multilayer electronic structures. The compositions have a reduced tendency to cause substrate distortion or bowing (i.e., deviation from planarity). The compositions comprise, by weight complementally, finely divided powders of
  a. 65–90% of one or more glasses having a softening point greater than about 700° C. and a thermal expansion coefficient less than that of alumina, and
  b. 10–35% crystalline fillers which are, based on the total weight of the composition
   1. 0–25%, preferably 0–20%, $MgTiO_3$, and/or
   2. 0–35% mixtures of MgO and $TiO_2$.

Where the weight of $MgTiO_3$ in the powder compositions is less than 10%, sufficient crystalline MgO and $TiO_2$ are present in such molar proportions that in the fired dielectric layer(s) in the multilayer structures there will be at least 10% crystalline $MgTiO_3$. Furthermore, in the fired dielectric layer(s) there is no more than 25%, preferably no more than 20%, $MgTiO_3$ present (whether added to the unfired powder compositions as preformed $MgTiO_3$ or the result of reaction of MgO and $TiO_2$ during firing), but there may be an excess of MgO or $TiO_2$ up to a total crystalline oxide content of 35%.

The powder compositions preferably comprise 86–82% (a) and 14–18% (b). Preferably the compositions comprise only preformed $MgTiO_3$ in component (b). Also preferably component (a) is Ti-free.

The compositions may be dispersed in an inert liquid printing vehicle.

Also part of this invention are multilayer electronic structures such as capacitors and multilevel structures comprising as sequential layers on a substrate a bottom electrode on and adherent to said substrate, a dielectric layer over and adherent to at least part of said bottom electrode, and a top electrode over and adherent to at least part of said dielectric layer, wherein said dielectric layer consists essentially of, by weight complementally,
  a. 65–90% one or more glasses having a softening point greater than about 700° C. and a thermal expansion coefficient less than that of alumina, and
  b. 10–35% crystalline fillers which are
   1. $MgTiO_3$ and/or
   2. mixtures of MgO and $TiO_2$, provided that there is 10–25%, preferably 10–20%, $MgTiO_3$ in the fired dielectric layer and 0–25% MgO or $TiO_2$.

Such devices include the multilayer capacitors described in the examples below or in multilevel electronic patterns.

The dielectric layers made using the compositions of this invention minimize alumina substrate bowing during firing, and further can produce good electrical properties (e.g., dielectric constant below 10 and Q above about 400).

DETAILED DESCRIPTION

The compositions of the present invention comprise powders of glass and certain crystalline oxide fillers. These powders are sufficiently finely divided to be used in conventional screen printing operations. Generally, the powders are sufficiently finely divided to pass through a 400-mesh screen (U.S. Standard Sieve Scale), and preferably have an average particle size in the range 0.5–15 microns, preferably 1–5 microns, with substantially all particles in the range 1–20 microns. To achieve these sizes, the powders may be ground in a mill (ball or multidimensional) prior to use.

The glass and crystalline oxides and their relative proportions are chosen such that they will cause reduced distortion (bowing) of the alumina substrate upon firing of the dielectric. Some uses can tolerate more bowing than can others.

The glasses used are substantially nonconductive and have a softening point (the temperature at which the glass deforms rapidly) greater than about 700° C. and have a thermal expansion coefficient less than that of alumina (70° × $10^{-7}$/° C.). Generally, glasses with less than a total of 30% $Bi_2O_3$ plus PbO are preferred.

The glasses in the present invention are prepared from suitable batch compositions of oxides (or oxide precursors such as hydroxides are carbonates) by melting any suitable batch composition which yields the desired compounds in the desired proportions. The batch composition is first mixed and then melted to yield a substantially homogeneous fluid glass. The temperature maintained during this melting step is not critical, but is usually within the range 1450°–1550° C. so that the rapid homogenation of the melt can be obtained. After a homogeneous fluid glass is obtained, it is normally poured into water to form a glass frit.

$MgTiO_3$ has a thermal coefficient of expansion greater than that of alumina. This crystalline oxide, sometimes referred to as ternary oxide herein, may be present in the (unfired) powder compositions of this invention, or alternately may be formed upon firing of the dielectric in the multilayer configuration. Thus, the powder compositions may contain some or no ternary oxide, but if less than 10% ternary oxide is present in the powder compositions; there will be sufficient precursor cyrstalline oxides present (MgO and $TiO_2$) to form at least 10% crystalline $MgTiO_3$ upon firing. Thus, if 5% $MgTiO_3$ were present in the powder composition, there would be sufficient precursor oxides in the powder to form at least 5% more $MgTiO_3$ in the fired dielectric layer.

The powder comprises a total of 10–35% $MgTiO_3$ plus MgO and $TiO_2$. Less than 10% $MgTiO_3$ in the fired dielectric does not provide adequate reduction in substrate bowing. More than 35% crystalline oxides in the fired dielectric results in porous dielectric layers. Porosity can cause sinking of the conductor layer into and through the dielectric, and hence shorting.

When precursor oxides MgO and $TiO_2$ remain in the fired dielectric layer, the total weight of $MgTiO_3$ and precursor crystalline oxides does not exceed 35%, but at least 10% $MgTiO_3$ is present. Thus the powder compositions comprise, by weight complementally, 10–35% crystalline oxides and 90–65% glass, preferably 14–18% crystalline oxides and 86–82% glass. The compositions of this invention are printed as a film in the conventional manner onto alumina substrates bearing a prefired electrode metallization. Preferably, screen or stencil printing techniques are employed. The composition is printed as a finely divided powder in the form of a dispersion in an inert liquid vehicle. Any inert liquid may be used as the vehicle, including water or any one of various organic liquids, with or without thickening and/or stabilizing agents and/or other common additives. Exemplary of the organic liquids which can be used are the aliphatic alcohols; esters of such alcohols, for example, the acetate and propionates; terpenes such as pine oil, terpineol and the like; solutions of polyisobutyl methacrylate in 2,2,4-trimethyl pentanediol-1,3-monoisobutyrate; solutions of resins such as the polymethacrylates of lower alcohols, or solutions of ethyl cellulose, in solvents such as pine oil and the monobutyl ether of ethylene glycol monoacetate. The vehicle may contain or be composed of volatile liquids to promote fast setting after application to the substrate.

The ratio of vehicle to inorganic solids may vary considerably and depends upon the manner in which the dispersion is to be applied and the kind of vehicle used. Generally, from 0.4 to 9 parts by weight of inorganic solids per part by weight of vehicle will be used to produce a dispersion of the desired consistency. Preferably, 2–4 parts of inorganic solids per part of vehicle will be used.

After the compositions of the present invention are printed onto prefired ceramic substrates (with metallizations thereon), the printed substrate is refired. Generally, the dielectric composition is fired in the temperature range 800–975° C. to form a continuous dielectric layer. Preferably, the firing is conducted at a peak temperature of about 900°–950° C. Peak temperature is held for about 10 min. normally, although 5–30 min. may be used by one skilled in the art. Belt or box furnaces may be used. Where a belt furnace is used the total firing cycle is normally about 40–60 min. These compositions may be fired in air or in nitrogen, but much better results are obtained in air. Often a second dielectric layer is printed and fired directly over the first to prevent pinholing.

Although the compositions of this invention are designed to be used as dielectric layers in multilayer structures formed on alumina substrates, these compositions may be used with other substrates, including substrates having thermal expansion characteristics similar to those of alumina. Typical commercially available densified (prefired) alumina substrates comprise above 90% alumina; for example, American Lava Corp. Alsimag 614 contains 96% alumina.

The multilayer structures of this invention include conductive layers (e.g., capacitors) or lines (e.g., complex circuits with dielectric pads or "crossovers" at the point of crossover of the conductor lines). The geometry of the multilayer structure is not of the present invention, but will be designed in the conventional manner by those skilled in the art, according to their requirements. Amin U.S. Pat. No. 3,785,837, discusses crossover dielectrics and Amin U.S. Pat. No. 3,787,219 discloses multilayer capacitors. Structures with a multiplicity of layers can be provided with the compositions of this invention.

EXAMPLES

In the following examples presented to illustrate the invention, all parts percentages, ratios, etc. are by weight, unless otherwise stated. In a number of examples multilayer capacitors of two conductors and an intermediate dielectric were printed and fired on an alumina substrate to demonstrate the utility of the present invention. In other examples the dielectric composition was printed on an alumina substrate and fired to illustrate an advantage of the present invention, reduced substrate deformation or bowing due to the fired dielectric layer. In every example the substrate was a preferred (densified) 96% alumina substrate, American Lava Corp. Alsimag 614.

The glasses used in these examples were prepared as follows. A physical mixture, in the desired proportions, of metal oxides, hydroxides and/or carbonates was prepared and melted at a peak temperature of 1450°–1550° C. and then quenched by pouring into water. The glasses were then finely ground in a conventional 1-liter ball mill with 26¼-inch alumina balls (36 g. glass, 15 ml. water, milled 2 hr.), filtered and dried. The powder was screened through a 400-mesh screen. Average particle size was about 1–5 microns, with substantially all particles between about 1–20 microns.

The crystalline oxides used, i.e., MgO, $TiO_2$ and $MgTiO_3$, were purchased commercially, identified by X-ray, and reduced in size by milling 100 g. with 100 ml. water in a multidimensional mill for 2 hr. The particle size of the milled oxide was in the range of about 1–20 microns, average about 1–5 microns.

Dispersions of glass and crystalline oxides according to this invention were prepared by mixing the desired relative amounts of finely divided glass and crystalline oxides (usually in a Hoover muller) with a vehicle of suitable consistency and rheology for screen printing. The solids/vehicle ratio was 77/23, that is, 77 parts inorganic solids (glass and crystalline oxides) were mixed with a vehicle of 22.8 parts of a mixture of polymer and solvent (20% polyisobutyl methacrylate in 80% of a solvent which was 2,2,4-trimethyl pentanediol-1,3-monoisobutyrate) and 0.2 parts of a wetting agent (soya lecithin). In some instances up to 2 additional parts of that solvent was added to modify rheology.

EXAMPLE 1

The dielectric composition of the present invention was printed and fired in air on an alumina substrate to demonstrate the reduction in substrate distortion (bowing) with the compositions of the present invention. The substrate was 2 inches (5.08 cm.) by 1 inch (2.54 cm.) by 25 mils (0.64 mm.) thick. A 200-mesh printing screen was masked to the center (a ¼-inch or 0.64 cm. square) so that the one entire surface of the substrate would be covered with dielectric composition, except for that central square. First the thickness (height) of that central square was measured on each substrate with a Starrett gauge. Percent bowing equals change in height at the center of the substrate divided by the thickness of the substrate, each in mils. The glass has a thermal expansion coefficient of $50° \times 10^{-7}/°$ C. The glass contained 40% $SiO_2$, 18% BaO, 5% CaO, 6% $B_2O_3$, 10% $Al_2O_3$, 5% MgO, 8% ZnO, and 8% PbO. A layer of the dielectric composition of 16 parts $MgTiO_3$ and 84 parts glass was then printed through that patterned 200-mesh screen on the substrate. The print was dried at 120° C. for 10 min. and then a second dielectric print was printed over the first and dried as before. The printed substrate was fired in a box furnace at 950° C. for 10 min.

Two additional dielectric layers were printed and dried as before; firing was repeated as before. Height at the center of the substrate was measured again. The center of the substrate was bowed slightly negatively (about 0.5%) versus the substrate before any printing or firing as described herein.

The dielectric layer was found to have an excellent appearance and to be non-porous by an ink test, as follows. A drop of water soluble ink (Sheaffers Skrip deluxe blue No. 2) was placed on the fired dielectric and allowed to stand for about a minute, then washed under running water for about 5 sec. If a stain remains the sample is considered porous.

COMPARATIVE SHOWING A

Example 1 was repeated except that only the glass was used. No $MgTiO_3$ or any other crystalline filler was present. Although the dielectric appearance was again excellent, the substrate was found to have bowed +24.4%.

COMPARATIVE SHOWING B

Example 1 was repeated except that the inorganic powder contained 26% crystalline MgO and 74% glass. The amount of bowing was greater than in Example 1, and the dielectric layer was unacceptable due to considerable cracking and surface roughness. This demonstrates the importance of $MgTiO_3$.

EXAMPLE 2

Example 1 was repeated using a dielectric composition containing less $MgTiO_3$, 10% (plus 90% glass). Substrate bowing was +5.5%, versus only about −0.5% in Example 1 using 16% $MgTiO_3$ (the substrate is nearly flat) and versus +24.4% bowing in Showing B using 100% glass. Thus, 10% $MgTiO_3$ is not preferred.

EXAMPLE 3

Example 1 was repeated using 84 parts glass and 16 parts crystalline filler of a 1/1 molar ratio of $MgO/TiO_2$, versus 16 parts preformed $MgTiO_3$ and 84 parts glass in Example 1. Substrate bowing was +6.2%. Hence preformed $MgTiO_3$ is preferred over $MgO/TiO_2$ mixtures, although such mixtures are an improvement over compositions of glass alone (Showing B) and MgO alone (Showing A).

EXAMPLES 4–7

In these examples multilayer capacitors were prepared using the dielectric compositions of this invention. The glass was that of Example 1. The Table sets forth the identity and relative proportions of the inorganic solids, from which dispersions were formed as before. The substrate dimensions were 1 inch (2.54 cm.) by 1 inch (2.54 cm.) by 25 mils (0.64 mm.) thick.

In Examples 4, 6 and 7, a bottom electrode (a keyhole pattern of a 400 mil circle with electrode tabs extending therefrom) was printed on the substrate with a gold composition through a 325-mesh screen, dried at 125° C. for 10 min. and fired in air at 900° C. for 10 min. The gold composition contained 80.3 parts finely gold and 3.7 parts finely divided glass binder dispersed in 16 parts vehicle (8% ethyl cellulose/94% terpineol). The fired electrode thickness was about 0.7 mils.

In Example 5, the electrode was fired in nitrogen at 900° C. for 10 min. The electrode material comprised a base metal, copper (80.6 parts finely divided copper and 6.2 parts finely divided glass) dispersed in 13.2 parts vehicle (2.5 parts ethyl cellulose, 48.5 parts dibutyl phthalate, 46.6 parts terpineol and 2.4 parts soya lecithin).

A dielectric layer (a 440 mil circle) was printed over the fired bottom electrode, overlapping the bottom electrode in the area where the top electrode (a keyhole pattern) was intended to be printed. The dielectric layer was dried at 125° C. for 10 min. and then a second dielectric layer was printed on the first and dried.

TABLE

CAPACITOR FORMATION

| Example (No.) or Showing (Letter) | Crystalline Fillers (and molar ratio) | Filler to Glass Wt. Ratio | Wt. % Performed Ternary Oxide among Inorganic Powders In Composition | Diel. Constant at 1 kHz | Diss. Factor at 1 kHz(%) | Q at 1 MHz | Diel. Thickness (Mils) | Breakdown Voltage (Volts AC) | IR (ohms) |
|---|---|---|---|---|---|---|---|---|---|
| 4 | $MgTiO_3$ | 16/84 | 16 | 7.2 | 0.1 | 707 | 2.4 | 1000 | $5 \times 10^{12}$ |
| 5 | 2 MgO 1 $TiO_2$ | 26/74 | 0 | 6.8 | 0.28 | 640 | 2.4 | 900 | $10^{12}$ |
| 6 | $MgTiO_3$ | 10/90 | 10 | 6.8 | 0.4 | 789 | 2.2 | 1200 | $10^{13}$ |
| 7 | 1 MgO 1 $TiO_2$ | 16/84 | 0 | 9.5 | 0.6 | 807 | 2.2 | 800 | $2 \times 10^{12}$ |

The structure was refired at 900° C. for 10 min. The thickness of the dielectric layer is set forth in the Table.

A top electrode (keyhole pattern) was printed and dried as before over the fired dielectric layer using the same electrode composition and firing atmosphere as had been used for the bottom electrode in that example, and then fired at 900° C. for 10 min.

Q, a measure of loss of power in a resonant circuit (the higher the Q, the lower the power loss), was determined by reading capacitance (pF) and conductance (mho) from a General Radio 1682 (1 MHz) bridge and then using the following equation $$Q = 2\pi \frac{\text{Capacitance}}{\text{Conductance}}$$

Dissipation factor in decimals was determined using a General Radio 1672A (1 kHz) bridge, and was then converted into percentage.

Dielectric constant was determined from the capacitance, as follows:

$$K = \frac{C \times t \times 10^6}{0.224 \times A}$$

where C is capacitance (pF) t and A are thickness and area of the dielectric, respectively, in mils.

IR (dielectric loss) was determined at 100 volts D.C. using a Penn Airborne Products Co. Megatrometer Model 710.

Breakdown voltage (volts AC) was determined using an Associated Research Inc. Hypot Breakdown tester.

As indicated in the Table, good electrical properties were obtained with each composition.

The best overall performance was observed with 16% preformed $MgTiO_3$ (0.1% dissipation factor, low K of 7.2, and Q of 707).

I claim:

1. Compositions of finely divided inorganic powders useful for forming dielectric layers in multilayer electronic structures of conductive and dielectric layers on an alumina substrate; those dielectric layers being capable of producing such multilayer structures having a dielectric constant below 10 and a dissipation factor of 0.6% or less, each at 1 kHz., and a quality factor above about 400 at 1 MHz.; the compositions consisting essentially of, by weight, a. 65-90% of one or more non-conducting glasses having a softening point greater than 700° C. and a thermal expansion coefficient less than that of alumina, and the balance is b. 10-35% of crystalline fillers which are, based on the total weight of the composition,
 1. 0-25% $MgTiO_3$ and/or
 2. 0-35% mixtures of precursor crystalline oxides MgO and $TiO_2$ capable of forming $MgTiO_3$ provided that where the weight of $MgTiO_3$ in these compositions is less than 10%, the relative proportions of precursor crystalline oxides (2) are such that in the fired dielectric layer(s) in the aforesaid multilayer electronic structure(s) there will be a total of at least 10% $MgTiO_3$, and further provided that the relative proportions of precursor crystalline oxides are such that in the fired dielectric layers there will be no more than 25% $MgTiO_3$.

2. Compositions according to claim 1 of 86-82% (a) and 14-18% (b).

3. Compositions according to claim 1 wherein component (b) (1) comprises 0-20% $MgTiO_3$.

4. Compositions according to claim 1 wherein component (b) is $MgTiO_3$.

5. Compositions according to claim 2 wherein component (b) is $MgTiO_3$.

6. Compositions according to claim 3 wherein component (b) is $MgTiO_3$.

7. Compositions according to claim 1 wherein component (a) is Ti-free.

8. Compositions according to claim 2 wherein component (a) is Ti-free.

9. Compositions according to claim 3 wherein component (a) is Ti-free.

10. Compositions according to claim 4 wherein component (a) is Ti-free.

11. Compositions according to claim 1 dispersed in an inert liquid vehicle.

12. Compositions according to claim 2 dispersed in an inert liquid vehicle.

13. Compositions according to claim 3 dispersed in an inert liquid vehicle.

14. Compositions according to claim 4 dispersed in an inert liquid vehicle.

15. Compositions according to claim 5 dispersed in an inert liquid vehicle.

16. Compositions according to claim 6 dispersed in an inert liquid vehicle.

17. In multilayer electronic structures comprising as sequential layers on a prefired alumina substrate a bottom electrode on an adherent to said substrate, a dielectric layer over and adherent to at least part of said bottom electrode, and a top electrode over and adherent to at least part of said dielectric layer, improved multilayer structures, capable of having a dielectric constant below 10 and a dissipation factor of 0.6% or less, each at 1 kHz., and a quality factor above about 400 at 1 MHz.; wherein said dielectric layer consists essentially of, by weight
  a. 65–90% non-conducting glass having a softening point greater than 700° C. and a thermal expansion coefficient less than that of alumina, and the balance is
  b. 10–35% of crystalline fillers which are, based on the total weight of the dielectric layer,
   1. 10–25% $MgTiO_3$ and
   2. 0–25% MgO or $TiO_2$.

18. Structures according to claim 17 wherein component (b) (1) is 10–20% $MgTiO_3$.

19. Structures according to claim 17 wherein the dielectric layer comprises 86–82% (a) and 14–18% (b).

20. Structures according to claim 18 wherein the dielectric layer comprises 86–82% (a) and 14–18% (b).

21. Structures according to claim 17 wherein component (b) is $MgTiO_3$.

22. Structures according to claim 18 wherein component (b) is $MgTiO_3$.

23. Structures according to claim 17 wherein component (a) is Ti-free.

* * * * *